United States Patent [19]

Yatsuo et al.

[11] 4,016,592
[45] Apr. 5, 1977

[54] LIGHT-ACTIVATED SEMICONDUCTOR-CONTROLLED RECTIFIER

[75] Inventors: Tsutomu Yatsuo; Nobutake Konishi, both of Hitachi, Japan

[73] Assignee: Hitachi, Ltd., Japan

[22] Filed: Mar. 4, 1975

[21] Appl. No.: 555,279

[30] Foreign Application Priority Data

Mar. 15, 1974  Japan .................... 49-29135

[52] U.S. Cl. .................... 357/38; 357/30;
357/20; 357/55; 357/86
[51] Int. Cl.$^2$ .................... H01L 29/74
[58] Field of Search ........ 357/38, 39, 30, 55,
357/86, 20

[56] References Cited

UNITED STATES PATENTS 3,579,060   5/1971   Davis ........................ 357/38
3,697,833   10/1972   Nakata ...................... 357/38
3,893,153   7/1975   Page et al. ................ 357/30

*Primary Examiner*—John Zazworsky
*Assistant Examiner*—Joseph E. Clawson, Jr.
*Attorney, Agent, or Firm*—Craig & Antonelli

[57] ABSTRACT

A light-activated semiconductor-controlled rectifier apparatus has four layers of PNPN. The outer N-type layer comprises a first portion having a plurality of short-circuiting apertures and a second portion substantially separated from the first portion by an intermediate layer of P-type. One of the main electrodes is in ohmic contact with the first portion, with the intermediate P-type layer exposed through the short-circuiting apertures, with the periphery of the second portion and with the portion of the intermediate layer adjacent to the second portion, so that a photo signal is radiated on the second portion.

13 Claims, 10 Drawing Figures

LIGHT-ACTIVATED SEMICONDUCTOR-CONTROLLED RECTIFIER

BACKGROUND OF THE INVENTION

1. Field of the Invention

The present invention relates to a light-activated semiconductor-controlled rectifier device which is turned on by a photo signal.

2. Description of the Prior Art

The light-activated semiconductor-controlled rectifier device (hereinafter referred to as the photo thyristor) having such a function as to be switched from the forward-blocked state to a conducting state by the radiation of light, like the ordinary electric gate type thyristor, comprises at least a semiconductor substrate with four continuous layers of PNPN and a couple of main electrodes in ohmic contact with the two outer layers of the semiconductor substrate. This photo thyristor is different from the electric gate type thyristor in that in the electric gate type thyristor a trigger current is supplied from the gate electrode electrically connected to, say, one of the intermediate layers, whereas the photo thyristor is supplied with a trigger current in the form of the photo current generated in the semiconductor substrate by the radiation of light from a light source electrically insulated from the semiconductor substrate. In order to improve the firing sensitivity of the photo thyristor, it is necessary to provide a construction whereby the photo current is generated and utilized efficiently. The conventional photo thyristor, especially, a device of comparatively large capacity, has the disadvantage that the photo firing sensitivity is reduced due to the limitations on the forward voltage increasing rate $dv/dt$ and the breakdown voltage at high temperatures. This fact will be explained more in detail below with reference to the accompanying drawings. A prior art type photo thyristor is shown in FIG. 1 and FIG. 2. A semiconductor substrate 1 comprises four layers including a P-type emitter layer $P_E$, an N-type base layer $N_B$, a P-type base layer $P_B$ and an N-type emitter layer $N_E$ successively arranged between a pair of main surfaces 11 and 12 located on opposite sides of the semiconductor substrate 1. The $P_B$ layer is exposed to the other main surface 12 through a multiplicity of short-circuiting apertures 2 scattered over the entire area of the $N_E$ layer and through substantially the central portion of the $N_E$ layer. Reference symbols $J_1$, $J_2$ and $J_3$ show first, second and third PN junctions formed between $P_E$ layer and $N_B$ layer, between $N_B$ layer and $P_B$ layer, and between $P_B$ layer and $N_E$ layer respectively. Numeral 3 shows an anode in ohmic contact with the $P_E$ layer on the one main surface 11, numeral 4 a cathode provided on the other main surface 12 which is in ohmic contact with the $N_E$ layer and the $P_B$ layer exposed by way of the short-circuiting apertures 2, and numeral 5 means for radiating a photo signal. When light is radiated from the photo signal radiating means on the surface of the $P_B$ layer exposed to the other main surface 12 through substantially the central portion of the $N_E$ layer with a forward voltage applied between the electrodes of the photo thyristor in such a manner as to render the anode 3 positive with respect to the cathode 4, a photo current is generated in the $P_B$ layer. This photo current flows toward the short-circuiting apertures 2 nearest to the portion radiated with light, as shown by arrows in the drawings, and by way of the short-circuiting apertures 2 reaches the cathode 4. This photo current forward-biases the innermost periphery of the third PN junction $J_3$ of the $N_E$ layer and the $P_B$ layer, where electrons are injected from the $N_E$ layer into the $P_B$ layer, so that the photo thyristor is switched from the forward blocked state to a conducting state and becomes to be turned on. If the inner radius of the $N_E$ layer, namely, the radius $R_1$ of the portion of the $P_B$ layer which is exposed through substantially the central portion of the $N_E$ layer is enlarged, the photo current generated by the radiation of the photo signal is dispersed among the peripheral short-circuiting apertures and therefore the density of the photo current for forward biasing the innermost periphery of the third PN junction $J_3$ is reduced, with the result that a great amount of photo current is required for turning on the device, thereby reducing the firing sensitivity thereof. On the contrary, if the value $R_1$ is reduced, the part of the $N_E$ layer on the path of the photo current is lengthened and therefore the innermost side of the third PN junction $J_3$ is strongly biased forwardly with a relatively small amount of photo current, resulting in an increased firing sensitivity. Since in this case the innermost peripheral side of the third PN junction $J_3$ is easily forward-biased by the displacement current and the leakage current of the second PN junction $J_2$, however, the disadvantage is that the critical increasing rate of applied voltage, namely, the $dv/dt$ capability and the breakdown voltage at high temperatures are decreased. In order for the innermost peripheral side of the third PN junction $J_3$ to be easily forward biased without any reduction in the $dv/dt$ capability or the breakdown voltage at high temperatures, the short-circuiting apertures 2 on the innermost peripheral side should be relocated inwardly toward the center to such an extent as to achieve a desired $dv/dt$ capability, together with the reduction of radius $R_1$. In this case, with the relocation of the short-circuiting apertures 2, the inner edge of the cathode 4 changes its position toward the center of the device, so that the light-radiated surface area is reduced thereby decreasing the amount of photo current generated, resulting in a relative reduction in the firing sensitivity.

As will be noted from the foregoing description, it has so far been very difficult to obtain a photo thyristor having a high firing sensitivity as well as high dt/dv capability and high breakdown voltage at high temperatures.

SUMMARY OF THE INVENTION

Accordingly, it is a general object of the invention to provide a light-activated semiconductor-controlled rectifier device with a novel structure.

Specifically, the object of the invention is to provide a light-activated semiconductor-controlled rectifier device obviating the above-mentioned disadvantage of the conventional device and having a superior photo firing sensitivity without any reduction in $dv/dt$ capability or breakdown voltage at high temperatures.

Specifically, the feature of the light-activated semiconductor-controlled rectifier device according to the invention for achieving the above-described objects resides in the fact that the outer layer radiated with light comprises first and second portions, that the first portion has a plurality of through apertures substantially uniformly distributed by way of which an adjacent intermediate layer is exposed, that the second portion is substantially separated from the first portion by the adjacent intermediate layer, that a main electrode is kept in ohmic contact with the first portion, the through apertures, the peripheral portion of the second portion and the adjacent intermediate layer exposed around the periphery of the second portion, and that a photo signal is radiated on the exposed surface of the second portion. The light-activated semiconductor-controlled rectifier device having the above-described structure is so constructed that the PN junction between the second portion and the adjacent intermediate layer is substantially uniformly short-circuited along the peripheral part of the second portion but never at the other part of the second portion, and therefore the lateral flow path of the photo current is lengthened, while on the other hand the PN junction between the outer layer and the adjacent intermediate layer is short-circuited at substantially the same rate at the first and second portions by the displacement current and leakage current, thus making it possible to improve the firing sensitivity, the dv/dt capability and the breakdown voltage at high temperatures.

DESCRIPTION OF THE PREFERRED EMBODIMENTS

The present invention will be described in detail below with reference to the accompanying drawings showing embodiments thereof.

Figure 1:
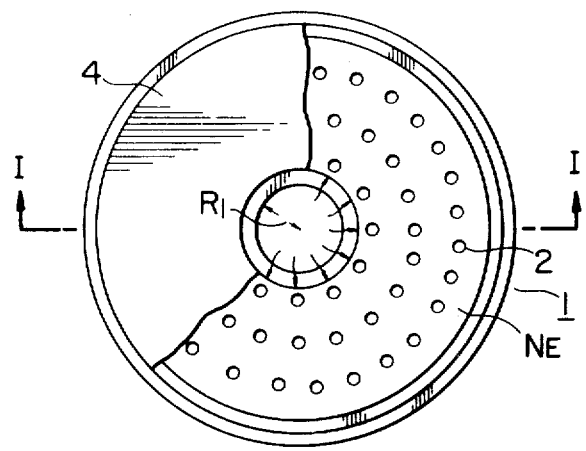
FIG. 1 is a schematic diagram showing a plan view of the conventional light-activated semiconductor-controlled rectifier device.
Figure 2:
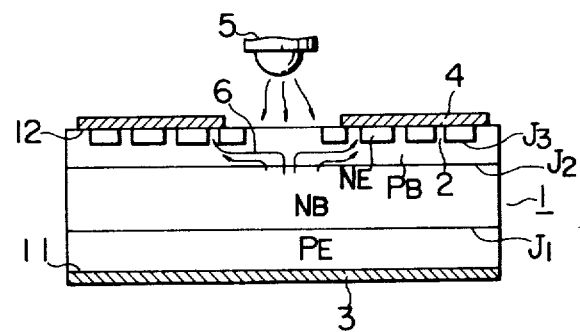
FIG. 2 is a schematic diagram showing a sectional view taken in line I—I of FIG. 1.
Figure 3:
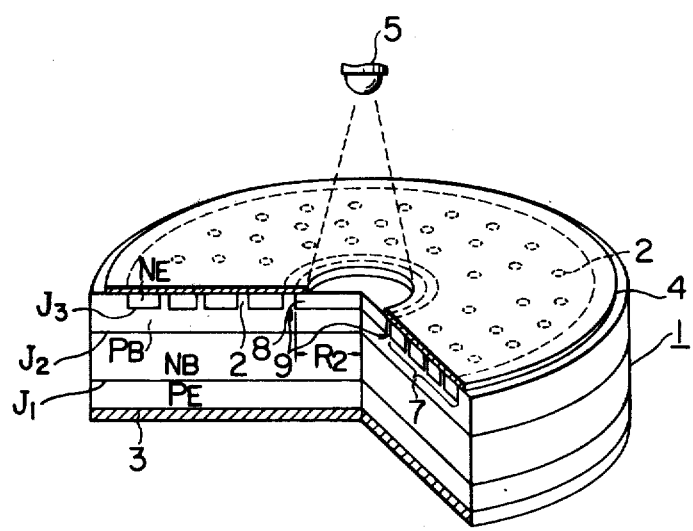
FIG. 3 is a perspective sectional view schematically showing the light-activated semiconductor-controlled rectifier device according to an embodiment of the invention.

A first embodiment of the light-activated semiconductor-controlled rectifier device according to the present invention (herein referred to as the photo thyristor) is shown in FIG. 3, in which like component elements are shown by like numerals in FIG. 1 and FIG. 2. The feature of the embodiment under consideration is that the N-type emitter layer $N_E$ (hereinafter referred to as the $N_E$ layer) comprises the first portion 7 having a plurality of substantially uniformly-distributed through apertures 2 by way of which the P-type base layer $P_B$ (hereinafter referred to as the $P_B$ layer) is exposed to the surface of the device, and the second portion 8 surrounded by the first portion 7, separated from the first portion 7 by the $P_B$ layer, having no through apertures and smaller in area than the first portion 7, so that light is radiated on the second portion 8. The cathode 4 is in ohmic contact with the first portion 7, the through apertures 2, the periphery of the second portion 8 and the surface of the $P_B$ layer exposed between the first portion 7 and the second portion 8.

In order to turn on the photo thyristor having the above-described construction, a light signal may be radiated on the surface of the second portion 8. In response to the radiation of the light signal, a photo current is generated at or in the neighborhood of the second PN junction $J_2$ corresponding to the second portion 8 and flows, as shown by arrow 9, laterally in the $P_B$ layer, namely, in the direction parallel to the second PN junction $J_2$ until it reaches the cathode 4 through that part of the $P_B$ layer between the first portion 7 and the second portion 8. This photo current causes a voltage drop within the $P_B$ layer, which in turn forward biases that part of the third PN junction $J_3$ which corresponds to substantially the center of the second portion 8, thus initiating the turning on of the device at that particular part. In this case, the radius $R_2$ of the second portion 8 is determined appropriately for the reason mentioned below.

Generally, the dv/dt capability and the breakdown voltage of the thyristor are determined by the arrangement of the short-circuiting apertures in the third PN junction $J_3$, and the maximum dv/dt capability is expressed as $$dv/dt_{max} = A \cdot V_D/C \cdot \rho_s \cdot K \quad (1)$$

where $A$ and $C$ are the area and junction capacitance of the second PN junction $J_2$ at which the displacement current occurs, respectively, $\rho_s$ a sheet resistance of the $P_B$ layer adjacent to the $N_E$ layer, $V_D$ a built-in voltage of the third PN junction $J_3$, and $K$ a short-circuiting coefficient determined by the short-circuiting structure of the device. When the device has an ordinary short-circuiting structure in which short-circuiting apertures each with the diameter $d$ are arranged at the intersections of a rectangular lattice at intervals of D, the short-circuiting coefficient $K_0$ is given by the equation below.

$$K_0 = \frac{D^2}{4} \left( \ln \frac{D}{d} + \frac{d^2}{4D^2} - 0.153 \right) \quad (2)$$

On the other hand, the short-circuiting coefficient $K_1$ of that part of the third PN junction $J_3$ corresponding to the second portion 8 is $$K_1 = \int_0^{R_2} \frac{r}{2} dr = \frac{R_2^2}{4} . \quad (3)$$

where $r$ is a distance from the center of the PN junction $J_2$ in the lateral direction. In the above equations, the displacement current is assumed to be generated uniformly in the second PN junction $J_2$. If the dv/dt capability of the photo thyristor shown in FIG. 3 is to be improved, the dv/dt capability of the light-receiving part, namely, the second portion 8 must be rendered to coincide with that of the first portion. In other words, $K_1$ is required to be equal to $K_0$. The value satisfying such a relation is expressed as $$R_2 = D\sqrt{\ln\frac{D}{d} + \frac{d^2}{4D^2} - 0.153} \qquad (4)$$

Figure 4:
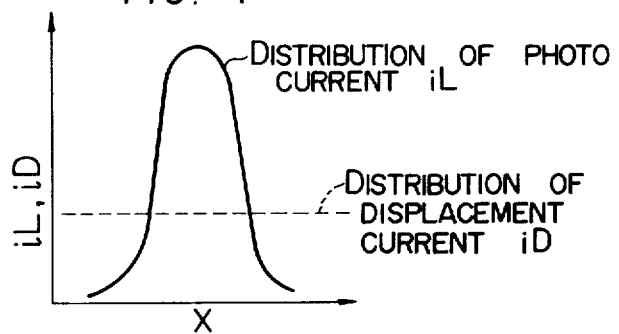
FIG. 4 is a diagram showing the distribution of displacement current and leakage current within the light-activated semiconductor-controlled rectifier device.

When $d$ is 0.2 mm and $D$ is 1.5 mm, for instance, $R_2$ is approximately 20 mm and therefore, by setting the radius $R_2$ of the second portion 8 at 20 mm, it is possible to achieve the same short-circuited state both for the second portion 8 and for the first portion 7 having an arrangement of the short-circuiting apertures 2, in the presence of the displacement current and leakage current generated uniformly from the second PN junction $J_2$, thus permitting the same level of the $dv/dt$ capability and breakdown voltage at high temperatures. It is to be noted that, the photo current is not generated uniformly at the second PN junction $J_2$ by the radiation of light signals, but differs with the intensity of light radiated. An example of distribution of photo current generated is shown in FIG. 4. Unlike the distribution of the displacement current shown by way of comparison, the photo current has a maximum point at the part subjected to the strongest radiation, while it becomes smaller the longer the distance from the maximum point. In the case of photo current having such a distribution, the part of the third PN junction $J_3$ corresponding to the center of the second portion 8 can be forward-biased more effectively, that is, more strongly by positioning the center of the second portion 8 at the point associated with the peak photo current.

Figure 5A:
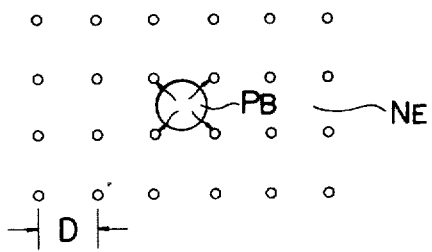
FIG. 5 is a diagram comparing the structure of the light-receiving part of the conventional light-activated semiconductor-controlled rectifier device with that of the device according to the invention.
Figure 5B:
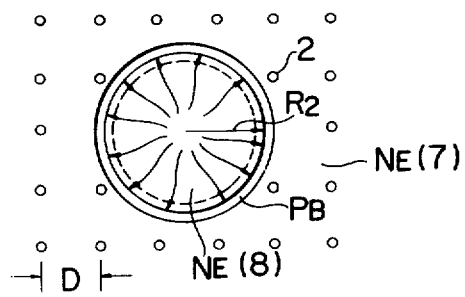

The diagram of FIG. 5 shows plan views of the construction of the light-receiving parts of the conventional photo thyristor (FIG. 5a) and the device according to the invention (FIG. 5b). As will be seen from the drawings under consideration, unlike the prior art device in which the short-circuiting apertures are arranged at intervals of, say, 15 mm over the entire surface of the device, the device according to the invention is provided with a junction part 40 mm in diameter which is not short-circuited, with the result that the light-receiving area is enlarged by approximately 10 times and the distance from the point associated with the peak photo current to the short-circuited portion of the nearest junction is substantially doubled. As a consequence, the photo current is increased and the flow path thereof lengthened thereby to effectively forward-bias that part of the third PN junction corresponding to the second portion 8.

With such a construction, it is possible to obtain a photo thyristor with high firing sensitivity which obviates the problem of an undesirable decrease in the $dv/dt$ capability and breakdown voltage at high temperatures without lowering the firing sensitivity. Specifically, the device according to the invention can be fired with a light-emitting diode (using GaAs as a base material) having the light output one fifth as low as the conventional device, thus realizing a photo thyristor (1200V, 100A) with the $dv/dt$ capability of 400V/$\mu$s.

Figure 6:
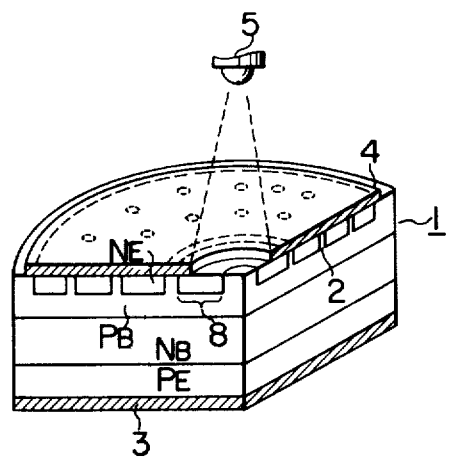
FIG. 6 shows a schematic perspective sectional view of another embodiment of the invention.

The second embodiment of the invention shown in FIG. 6 is different from the first embodiment in that in the second embodiment the $P_B$ layer is partially exposed almost to the center of the second portion 8 of the $N_E$ layer. In view of the fact that the $N_E$ layer is high in impurity concentration and hence inconveniently low in light transmission, the embodiment under consideration is such that the photo firing sensitivity is improved by exposing the $P_B$ layer at almost the center of the second portion 8 where the light radiated is greatest in amount.

Figure 7:
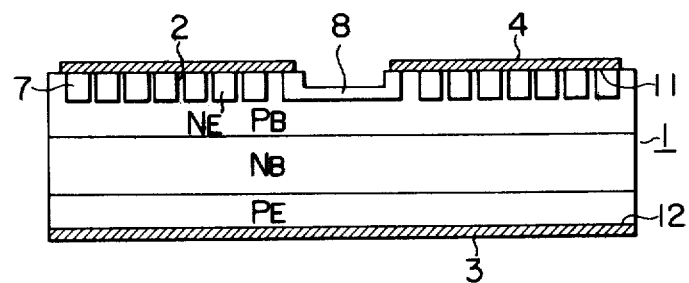
FIG. 7 is a schematic sectional view showing still another embodiment of the invention.

Reference is had to a third embodiment of the invention shown in FIG. 7. This embodiment is different from the first embodiment in that that part of the second portion 8 of the $N_E$ layer which is radiated with light is thinner than that of the first embodiment. The embodiment under consideration is also intended to obviate the disadvantage of the low light transmission of the $N_E$ layer as in the second embodiment and different from the second embodiment in that the purpose of obviating the disadvantage is achieved without reducing the lateral distance of the second portion along which the photo current flows. In view of the fact that the $N_E$ layer, which is usually formed by diffusion of phosphorus, is highest in impurity concentration at or in the vicinity of its surface, the part with a high impurity concentration where the light absorption capacity is high is eliminated by reducing the thickness of the $N_E$ layer, thus improving the light transmission and hence the firing sensitivity.

Figure 8A:
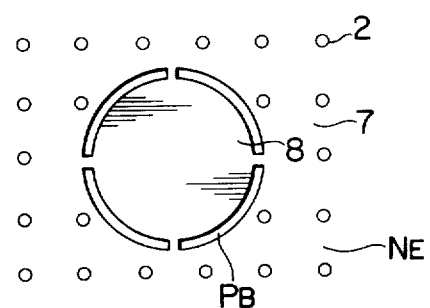
FIG. 8 is a plan view schematically showing the light-receiving part of a further embodiment of the invention.
Figure 8B:
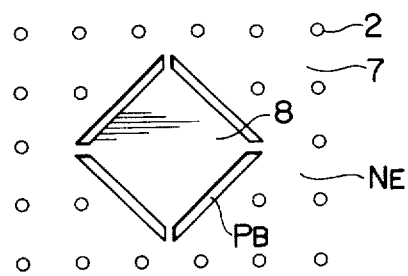

The second portion 8 of the $N_E$ layer of the photo thyristor according to the invention need not necessarily be circular but may take a rectangular or other form to attain the objects of the invention. Further, the objects of the invention are achieved with equal effect if the second portion 8 is separated from the first portion 7 of the $N_E$ layer by the $P_B$ layer not completely but partially connected therewith. Such a modification is illustrated in FIG. 8. The advantage of this modification is that the turn-on region is expanded more quickly by partially connecting the first portion 7 to the second portion 8. Furthermore, it is not necessarily required that the second portion 8 be completely surrounded by the first portion 7. Instead, it suffices if some part of the second portion 8 is adjacent to the first portion 7. In the last-mentioned case, too, the cathode 4 is maintained in ohmic contact with the first portion 7, the short-circuiting apertures 2, the periphery of the second portion 8 and the $P_B$ layer surrounding the second portion 8.

We claim:

1. A light-activated semiconductor-controlled rectifier device comprising:

a semiconductor substrate having a pair of main surfaces located on opposite sides of said substrate and at least four successive layers of alternately different conductivity, said four layers having a plurality of PN junctions formed between adjacent ones of said layers, one of said main surfaces including at least the exposed surfaces of one outer layer and the one intermediate layer adjacent to said one outer layer, the other of said main surfaces including at least the exposed surface of the other outer layer; said one outer layer including a first portion having a plurality of through apertures substantially uniformly distributed over said first portion, said one intermediate layer being exposed to said one main surface through said apertures of said one outer layer, and a second portion completely separated from said first portion by said one intermediate layer therebetween;

a first continuous, single-piece main electrode provided on said one main surface and in ohmic contact with at least the surface of said first portion, with that part of the surface of said one intermediate layer which is exposed through said through apertures, with the surface of said second portion at its periphery and with that part of the surface of said exposed portion of said one intermediate layer which is adjacent to said second portion;

a second main electrode provided on said other main surface and in ohmic contact with at least the surface of said other outer layer; and a photo signal radiating means provided in the vicinity of the surface of said second portion of said one main surface for turning on said device.

2. A light-activated semiconductor-controlled rectifier device according to claim 1, in which the area of said second portion is smaller than that of said first portion.

3. A light-activated semiconductor-controlled rectifier device according to claim 2, in which said second portion is surrounded by said first portion.

4. A light-activated semiconductor-controlled rectifier device according to claim 2, in which the thickness of at least that part of said second portion which is not in contact with said first main electrode is reduced.

5. A light-activated semiconductor-controlled rectifier device according to claim 4, in which said second portion is surrounded by said first portion.

6. A light-activated semiconductor-controlled rectifier device according to claim 2, in which said one intermediate layer is exposed at the center of said second portion.

7. A light-activated semiconductor-controlled rectifier device according to claim 6, in which said second portion is surrounded by said first portion.

8. A light-activated semiconductor-controlled rectifier device according to claim 1, wherein said first main electrode is in ohmic contact with the entirety of said first portion of said outer layer, that surface portion of said intermediate layer exposed through said apertures of said one outer layer, and the exposed portion of said one intermediate layer between said first and second portions of said one outer layer.

9. A light-activated semiconductor-controlled rectifier device comprising:

a semiconductor substrate having a first and second main surface located on opposite sides of said substrate and including a first semiconductor layer of a first conductivity type, one surface of which forms said second main surface of said substrate, a second semiconductor layer of a second conductivity type, opposite said first conductivity type, disposed on said first semiconductor layer and defining a first PN junction therewith, a third semiconductor layer of said first conductivity type disposed on said second semiconductor layer and defining a second PN junction therewith, one surface of said third semiconductor layer forming the first main surface of said substrate, a first semiconductor region of said second conductivity type disposed in a first surface portion of said third semiconductor layer and having a plurality of apertures therethrough so that semiconductor material of said third semiconductor layer extends through said apertures to said first main surface of said substrate and defines a plurality of third PN junctions with the semiconductor material of said first semiconductor region, and a second semiconductor region of said second conductivity type disposed in a second surface portion of said third semiconductor layer, the entirety of said second semiconductor region being spaced apart from said first surface portion thereof by the semiconductor material of a third surface portion of said third semiconductor layer therebetween and defining a fourth PN junction with the semiconductor material of said third semiconductor layer;

a first continuous, single-piece main electrode disposed on said first main surface of said substrate in ohmic contact with said first surface portion of said third semiconductor layer so as to cover said first semiconductor region and the semiconductor material of said third semiconductor layer extending through the apertures of said first semiconductor region, said third surface portion of said third semiconductor layer, and a peripheral surface portion of said second semiconductor region adjacent said third surface portion of said third semiconductor layer;

a second main electrode disposed on said second main surface of said substrate in ohmic contact with the one surface of said first semiconductor layer; and photo signal radiating means provided in the vicinity of the surface of said second surface portion for irradiating said second semiconductor region to turn on said device.

10. A light-activated semiconductor rectifier device according to claim 9, wherein said first main electrode is disposed in ohmic contact with the entirety of said first and third surface portions of said third layer and said peripheral surface portion of said second region.

11. A light-activated semiconductor rectifier device according to claim 9, wherein said second semiconductor region has an aperture therethrough so that semiconductor material of said third semiconductor layer extends through said aperture to said first main surface of said substrate, said aperture being spaced apart from an edge of said first main electrode by the semiconductor material of said second semiconductor region.

12. A light-activated semiconductor rectifier device according to claim 9, wherein the thickness of part of said second semiconductor region not in contact with said first main electrode is reduced.

13. A light-activated semiconductor rectifier device according to claim 9, wherein said first region surrounds said second region.

* * * * *